(12) United States Patent
Bueno et al.

(10) Patent No.: US 7,214,947 B2
(45) Date of Patent: May 8, 2007

(54) DETECTOR ASSEMBLY AND METHOD OF MANUFACTURE

(75) Inventors: Clifford Bueno, Clifton Park, NY (US); Forrest Frank Hopkins, Scotia, NY (US); Scott Stephen Zelakiewicz, Niskayuna, NY (US); Clarence Lavere Gordon, III, Glenville, NY (US)

(73) Assignee: General Electric Company, Niskayuna, NY (US)

( * ) Notice: Subject to any disclaimer, the term of this patent is extended or adjusted under 35 U.S.C. 154(b) by 124 days.

(21) Appl. No.: 11/090,675

(22) Filed: Mar. 25, 2005

(65) Prior Publication Data
US 2006/0214109 A1 Sep. 28, 2006

(51) Int. Cl.
*G01T 1/20* (2006.01)
(52) U.S. Cl. ................................. 250/370.11
(58) Field of Classification Search ............ 250/370.11
See application file for complete search history.

(56) References Cited

U.S. PATENT DOCUMENTS

| | | | |
|---|---|---|---|
| 3,389,255 A | 6/1968 | Takizawa et al. | |
| 3,872,309 A | 3/1975 | De Belder et al. | |
| 5,650,626 A * | 7/1997 | Trauernicht et al. | 250/370.09 |
| 5,663,005 A | 9/1997 | Dooms et al. | |
| 6,996,209 B2 * | 2/2006 | Marek | 378/98.8 |
| 2002/0162965 A1 * | 11/2002 | Okada et al. | 250/370.11 |
| 2004/0200973 A1 * | 10/2004 | Ogawa | 250/370.11 |
| 2005/0029462 A1 | 2/2005 | Lyons et al. | |
| 2005/0265517 A1 * | 12/2005 | Gary | 378/21 |
| 2006/0153334 A1 * | 7/2006 | Monin et al. | 378/91 |

* cited by examiner

*Primary Examiner*—David Porta
*Assistant Examiner*—Marcus Taningco
(74) *Attorney, Agent, or Firm*—Penny A. Clarke; Patrick K. Patnode

(57) ABSTRACT

A detector assembly including a radiation conversion layer directly coupled to a pixel array is provided. The radiation conversion layer is adapted to receive radiation passing through an object. The pixel array is adapted for receiving one of a plurality of signals representative of the radiation passing through the object or the corresponding optical signals from an optional intermediate light production layer and further configured for generating a corresponding image of the object.

21 Claims, 3 Drawing Sheets

DETECTOR ASSEMBLY AND METHOD OF MANUFACTURE

BACKGROUND OF THE INVENTION

The invention relates generally to inspection systems and more specifically to radiographic inspection techniques and assemblies.

Typically, for certain radiography systems, X-rays are transmitted through an object and converted into light of corresponding intensity using a light production layer. The light generated by the light production layer is provided to an electronic device. The electronic device is adapted to convert the light signals generated by the light production layer to corresponding electrical signals. The electrical signals are then used to construct an image of the object.

In radiography, X-ray scatter undesirably reduces (or fogs) the resulting image. To control scatter for medical systems, lead grids are used on the detector to provide geometric rejection of the scattered, secondary X-rays. However, for non-destructive testing applications, higher energy X-rays are used, so grids are not always adequate. In a non-destructive inspection industrial environment, Compton scatter from an object can be a large part of the X-ray flux impinging on the X-ray film cassette. To reduce the scatter, a metallic plate or screen may be employed, to filter the lower energy Compton scattered radiation.

Furthermore, the film can be further intensified by the photoelectrons emitted from the metallic plate when the plate is in intimate contact with said film. This enables a high spatial transfer of the X-ray pattern to the film. In nondestructive testing at X-ray energies above 150 kV, this is the primary mechanism for darkening the film, as the film is essentially transparent to X-rays in this regime. A similar benefit is experienced with computed radiography, where metal screens are placed in intimate contact with the computed radiography image plates. In digital radiography, metal screens have been placed on the back surface (the side toward the X-rays) of X-ray phosphor screens, especially under X-ray energies of 1 MeV and above. In such an embodiment, the phosphor is typically viewed by a digital or analog camera.

It would be desirable for the metallic plate or screen to shield the electronic device from impinging X-rays. However, the metallic plate or screen may not provide the desired electron intensification and scatter rejection in the MeV energy range. Thus, in typical radiography systems, the metallic plate or screen is of higher thickness to provide the required shielding while maintaining the intensification benefits.

Therefore, it is desirable to develop a compact detector assembly that is capable of producing high quality images with enhanced contrast, while also reducing and controlling scatter.

BRIEF DESCRIPTION

Briefly, according to one aspect of the invention, a detector assembly is provided. The detector assembly includes a radiation conversion layer configured to receive radiation passing through an object and to convert the radiation to a plurality of signals, and a pixel array configured for receiving the signals representative of the radiation passing through the object. The pixel array is further configured for generating a corresponding image of the object. The radiation conversion layer is directly coupled to the pixel array.

In another embodiment, a detector assembly is provided. The detector assembly includes a radiation conversion layer configured to receive radiation passing through an object, a light production layer configured to convert the radiation to corresponding optical signals representative of the radiation passing through the object and a pixel array directly coupled to the light production layer and configured for receiving the corresponding optical signals. The pixel array is further configured for generating a corresponding image of the object. The detector assembly also includes a contact layer disposed between the light production layer and the pixel array, the contact layer being configured to direct the optical signals to the pixel array.

In an alternate embodiment, a method for forming a detector assembly is provided. The method includes disposing a radiation conversion layer over a pixel array to form the detector assembly, wherein the radiation conversion layer is in direct contact with the pixel array.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
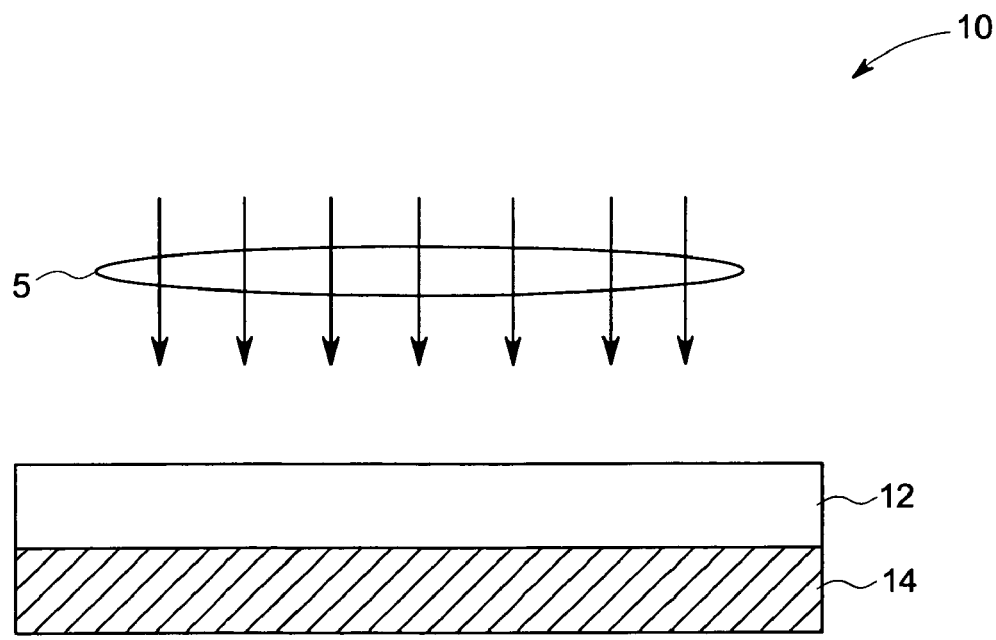
FIG. 1 is a diagrammatic view of one embodiment of a detector assembly including a radiation conversion layer and a pixel array.

FIG. 1 is a diagrammatic view of a direct conversion embodiment of a detector assembly implemented according to one aspect of the invention. For the exemplary embodiment shown in FIG. 1, detector assembly 10 includes a radiation conversion layer 12 and a pixel array 14. Each layer is described in further detail below.

Radiation conversion layer 12 is configured to receive radiation 5 such as X-rays passing through an object (not shown) and convert the radiation to a plurality of signals. For the embodiment shown in FIG. 1 the radiation conversion layer 12 comprises at least one metallic layer (also indicated by reference numeral 12). According to a particular embodiment, the thickness of the metallic layer 12 ranges from about 50 microns to about 2 millimeters. As used here, "about" should be understood to represent an accuracy of plus or minus ten percent (10%) of the recited lengths.

For the direct conversion embodiment of FIG. 1, pixel array, 14, is a direct conversion pixel array, which is configured to receive the signals that represent radiation passing through the radiation conversion layer and to generate the corresponding image of the object. As used herein, "signals" include primary X-rays, unattenuated X-rays, fluorescence X-rays and secondary electrons. Secondary electrons may be photoelectrons, Compton electrons, and Auger electrons.

As indicated in FIG. 1, the radiation conversion layer 12 is directly coupled to the pixel array 14. For the exemplary embodiment depicted in FIG. 1, the radiation conversion layer 12 includes at least one metallic layer, and the metallic layer is directly coupled to the pixel array 14.

Figure 2:
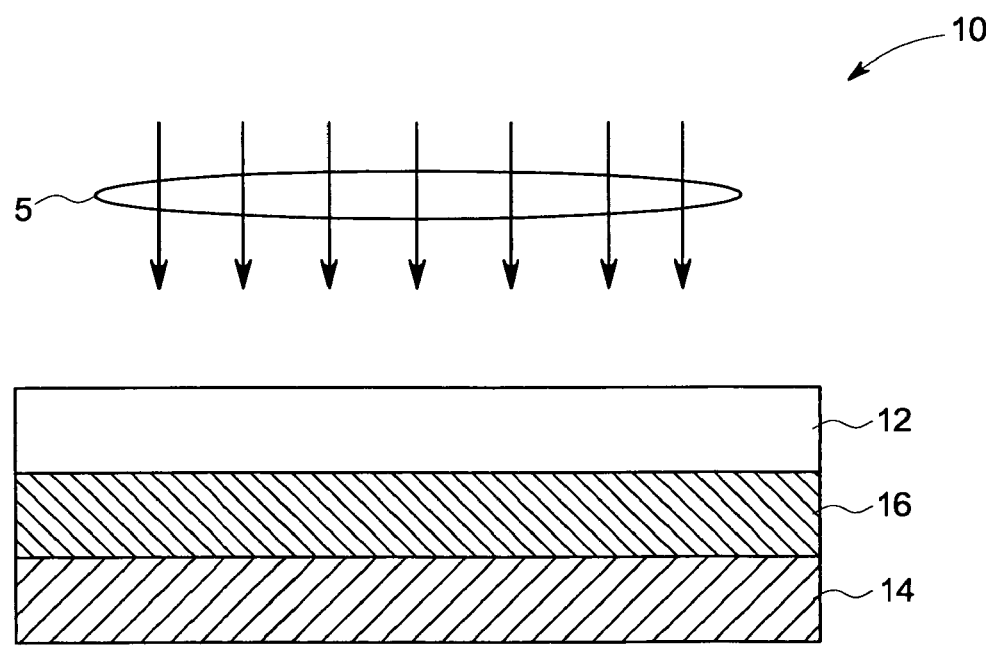
FIG. 2 is a diagrammatic view of one embodiment of a detector assembly including a radiation conversion layer, a light production layer, and a pixel array.

FIG. 2 illustrates an indirect conversion embodiment of the invention. The detector assembly 10 further includes a light production layer 16 disposed between the radiation conversion layer 12 and the pixel array 14. The light production layer 16 is configured to receive the radiation passing through the radiation conversion layer and to generate corresponding optical signals. Exemplary light production layers 16 are formed from X-ray phosphor materials, non-limiting examples of which include Gd2O2S:(Tb, Pr), Y1.34Gd0.6O3:(Eu, Pr)0.06 (HILIGHT), Lu2O3:(Eu3+, Tb), CsI:Tl, NaI:Tl, CsI:Na, Y2O3:Eu3+, Gd2O3:Eu, CdWO4, BGO (Bi4Ge3O12), LSO (Lu2SiO5:Ce), GSO (Gd2SiO5:Ce), YAP (YAlO3:Ce), LuAP (LuAlO3:Ce), LPS (Lu2Si2O7:Ce) and combinations thereof. This list is meant to be illustrative and not exhaustive. Other phosphors are also applicable.

For the indirect conversion embodiment described above with respect to FIG. 2, the pixel array 14 is a light sensitive pixel array configured for receiving the optical signals. When a patterned radiation conversion layer is employed, thick layers of scintillators (light production material) for example, in a range of about 50 microns to about 2 millimeters can be used, as light spread can be controlled in a patterned manner.

Figure 3:
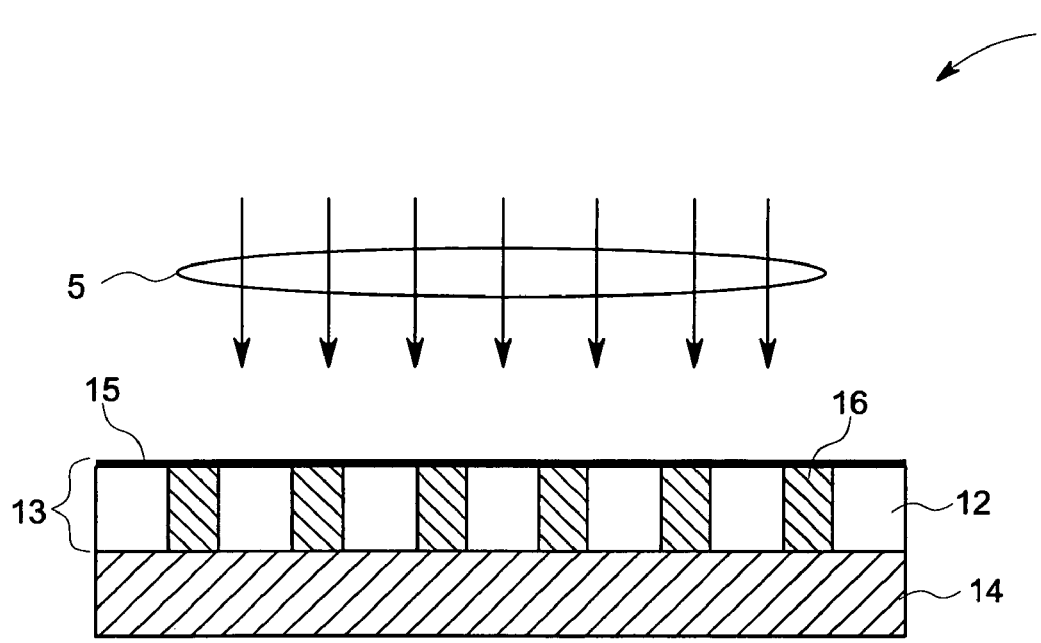
FIG. 3 is a diagrammatic view of one embodiment of a detector assembly including a patterned radiation conversion layer.

In a more specific embodiment, the radiation conversion layer comprises a patterned radiation conversion layer 13 as illustrated in FIG. 3. In one embodiment, the radiation conversion layer 12 is disposed in a pattern and the spaces between the radiation conversion layers are filled with light production material. In a more specific embodiment, the patterned radiation conversion layer is encapsulated within a metallic layer 15. The patterned metallic layer 12 improves spatial resolution, while offering control of both X-ray scatter and electron scatter within the metallic plate. In such an embodiment, electrons and fluorescence X rays from the radiation conversion layer result in the creation of optical photons in the light production material, which are captured by the pixel array 14. In addition direct X rays may create optical photons in the light production layer and contribute to the total light captured by pixel array 14.

There are many methods to couple the light production layer and the radiation conversion layer. In one embodiment, the light production layer is coated onto the radiation conversion layer, which may be a metallic layer. In another embodiment, the light production layer is directly coupled to the radiation conversion layer.

In a further embodiment, which is not expressly illustrated, the light production layer 16 includes scintillator needles (not shown) grown onto the radiation conversion layer, which can be achieved through a technique known in the art as a CsI:Tl deposition, for the particular CsI:Tl phosphor. Alternatively the radiation conversion layer 12 can also be deposited onto the light production layer 16 by techniques such as evaporation and sputtering.

Similarly, the light production layer 16 may be coated onto the pixel array 14 by any assortment of settling, or coating techniques, as mentioned above. Following the deposition, the radiation conversion layer 12 may be placed directly onto the coated phosphor.

Figure 4:
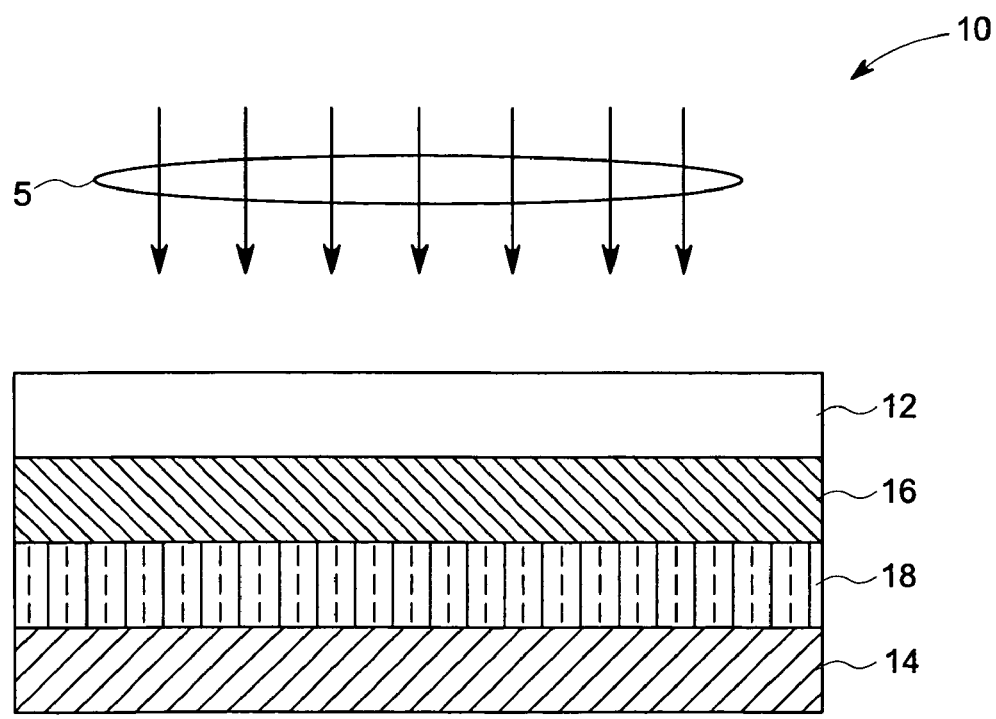
FIG. 4 is a diagrammatic view of one embodiment of a detector assembly including a radiation conversion layer, a light production layer, a contact layer and a pixel array.

FIG 4. illustrates an indirect conversion embodiment of the detector assembly that includes a radiation conversion layer 12, a light production layer 16, a contact layer 18, and a pixel array 14. The light production layer 16 is disposed between the radiation conversion layer 12 and the contact layer 18. In one specific embodiment, a thickness of the contact layer 18 is greater than that of the radiation conversion layer 12. The radiation conversion layer and the pixel array may be implemented as described with reference to FIG. 1. The contact layer 18 is described in further detail below.

Contact layer 18 is disposed between the light production layer and the pixel array. The contact layer is configured to direct the optical signals to the pixel array. The contact layer may include several optical fibers or a fiber optical plate. The contact layer shields the pixel array from damage and direct excitation that may propagate through the light production layer and the radiation conversion layer.

In one embodiment, where the contact layer comprises optical fibers, a cladding surrounds each optical fiber. The optical fiber filters off-angle, highly scattered light thus enhancing the contrast from an otherwise degraded image exiting the light production layer. The off angle light is absorbed in black material inserted into the detector 10 as either black fibers of black coatings around each fiber or cladding. The numerical aperture may be selected to reduce off-angle light accordingly. In one specific embodiment, the contact layer is about 6 millimeters thick.

As described with reference to FIG. 1, the radiation conversion layer comprises at least one metallic layer. For the exemplary embodiment depicted in FIG. 4, the radiation conversion layer 12 is coupled to the pixel array 14 via the light production layer 16 and the contact layer 18. The combination of the metallic radiation conversion layer 12 or patterned intensification layer 13 and the fiber optic component 18 offers a compact design that enables the construction of thin assemblies that can be placed into restricted spaces in objects of interest to perform nondestructive testing. The pixel array may include any one of charge coupled device arrays, CMOS imagers, amorphous silicon photodiodes and crystalline silicon photodiodes, microchannel plate based imaging devices and position sensitive gas detectors.

Figure 5:
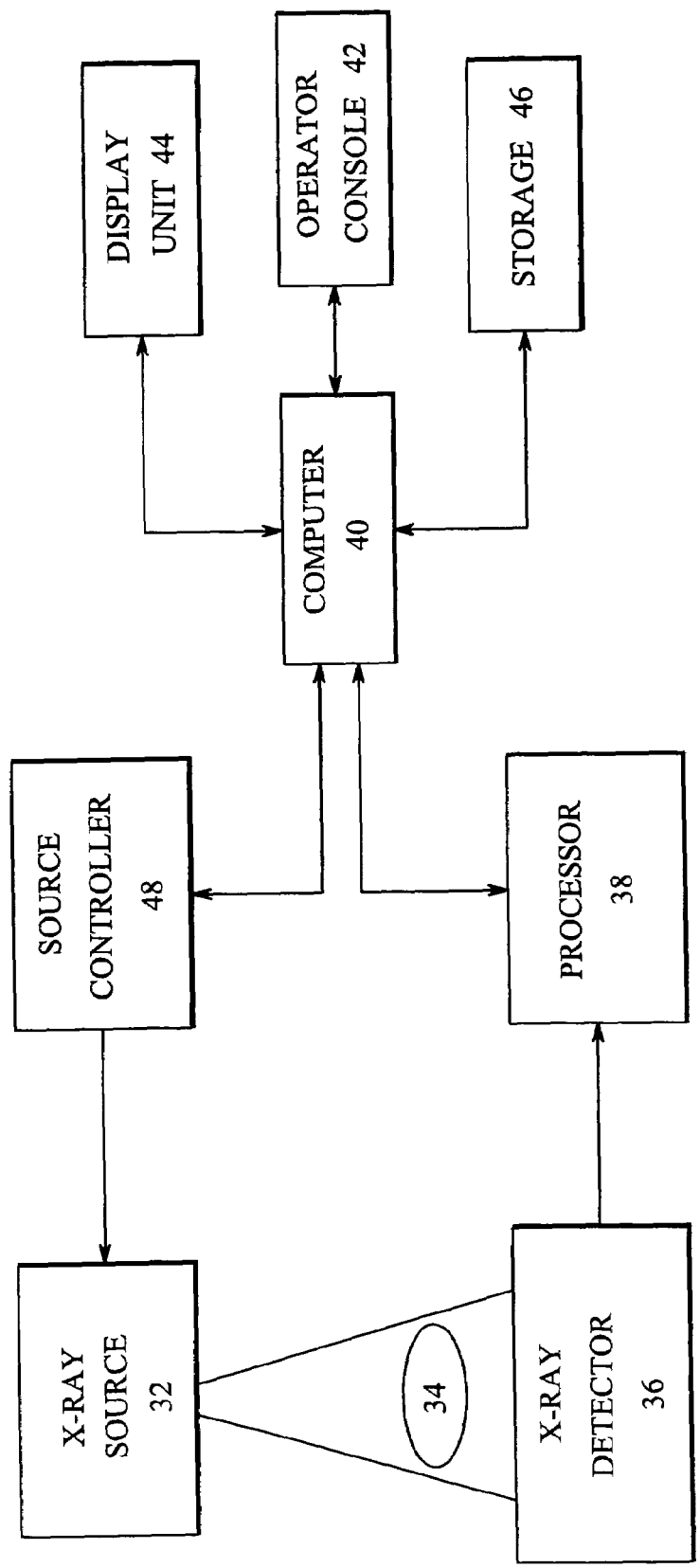
FIG. 5 is a block diagram of one embodiment of an X-ray system using a detector assembly.

The detector assemblies described with reference to FIG. 1 to FIG. 4 may be implemented in various inspection systems. An exemplary X-ray system is described in further detail below. FIG. 5 is a block diagram of an embodiment of system 30, which is an X-ray system designed both to acquire original image data and to process the image data for display and analysis in accordance with the present technique. Other imaging systems such as computed tomography systems, laminography systems, and digital radiography systems, which acquire three dimensional data for a volume, also benefit from the present techniques. The following discussion of X-ray system 10 is merely an example of one such implementation and is not intended to be limiting in terms of modality.

As used herein, "adapted to", "configured" and the like refer to devices in a system to allow the elements of the system to cooperate to provide a described effect; these terms also refer to operation capabilities of electrical or optical elements such as analog or digital computers or application specific devices (such as an application specific integrated circuit (ASIC)), amplifiers or the like that are programmed to provide an output in response to given input signals, and to mechanical devices for optically or electrically coupling components together.

X-ray system 30 includes an X-ray source 32 configured to emit X-ray radiation through object 34. X-ray source 32 may be a conventional X-ray tube producing X-rays having both high energy and low energy X-rays. Typically, the end-point energy of the X-rays varies from about 30 keV to about 16 MeV. The X-rays continue through object 34 and, after being attenuated by the object, impinge upon detector assembly 10. Detector assembly may be implemented using any of the techniques described with reference to FIG. 1 to FIG. 4.

Processor 38 receives signals from the detector assembly 10 and is configured to generate an image corresponding to the object being scanned. The processor is configured to determine an X-ray path geometry and determine an energy deposition profile for at least one segment of each of the X-ray paths. In one embodiment, the processor is further configured to generate an image of the object based on the energy deposition profile and the X-ray paths.

For the exemplary embodiment of FIG. 5, computer 40 communicates with processor 38 to enable an operator, using operator console 42, to view the generated image. The operator may view the image on display unit 44. The generated image may also be stored in storage device 46 which may include hard drives, floppy discs, compact discs, etc. The operator may also use computer 40 to provide commands and instructions to source controller 48. Source controller 48 provides power and timing signals to X-ray source 32.

The X-ray system can be used for various non-destructive applications in digital radiography systems or computed tomography systems. Such applications might include inspection of turbine blades and fan blades inside a jet engine, where high image contrast is needed to detect the smallest defect in these components, while a small detector is desired which is small enough to enter between the blades to reach an inspection location. Other applications include nondestructive testing methods using digital radiography systems, laminography systems, and computed tomography systems.

The above described techniques have many advantages including small size, high efficiency and better shielding for the pixel array. As the radiation conversion layer is placed in contact with the light production layer, and is directly coupled to the imaging device such as amorphous silicon, a CCD, CMOS imaging device, micro-channel plate based imaging devices, and position sensitive gas detectors, the size of the detector is substantially reduced.

The detector assembly also has increased efficiency for capturing light, and thus has a rapid decrease in exposure time. The radiation conversion layer also offers shielding to the imaging devices mentioned above. The radiation conversion layer, the light production layer and/or the intermediary fiber optic plate (thickness, numerical aperture, other scatter enhancement elements in the faceplate) may be interchanged on the imaging device to optimize performance for specific applications of interest.

Although only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A detector assembly comprising:
   a radiation conversion layer configured to receive radiation passing through an object and convert the radiation to a plurality of signals;
   a pixel array configured for receiving the signals representative of the radiation passing through the object and further configured for generating a corresponding image of the object; and
   at least one light production layer configured to receive the radiation passing through said radiation conversion layer and to generate the corresponding optical signals, wherein said light production layer is disposed between said radiation conversion layer and said pixel array, and wherein said pixel array comprises a light sensitive pixel array configured for receiving the optical signals.

2. The detector assembly of claim 1, wherein said radiation conversion layer comprises at least one metallic layer.

3. The detector assembly of claim 1, wherein said radiation conversion layer comprises a patterned radiation conversion layer.

4. The detector assembly of claim 1, wherein said light production layer is coated onto said radiation conversion layer.

5. The detector assembly of claim 1, wherein said light production layer is directly coupled to said radiation conversion layer.

6. The detector assembly of claim 1, wherein said light production layer comprises a plurality of needles grown onto said radiation conversion layer.

7. The detector assembly of claim 1, wherein said light production layer is coated onto said pixel array.

8. The detector assembly of claim 1, wherein said light production layer comprises a plurality of needles grown onto said pixel array.

9. The detector of claim 1, further comprising a plurality of light production layers, wherein said radiation conversion layer comprises a plurality of metallic layers.

10. The detector of claim 1, wherein said pixel array comprises a direct conversion pixel array configured to receive the radiation produced in said radiation conversion layer.

11. The detector of claim 1, further comprising a contact layer disposed between said light production layer and said pixel array, wherein said contact layer is configured to direct the optical signals to said pixel array.

12. The detector assembly of claim 11, wherein said contact layer comprises a plurality of optical fibers or a fiber optical plate.

13. The detector assembly of claim 11, wherein a thickness of said contact layer is greater than a thickness of said radiation conversion layer.

14. The detector of claim 1, wherein said pixel array is selected from the group consisting of charge coupled device arrays, CMOS imagers, amorphous silicon photodiodes, crystalline silicon photodiodes, micro-channel plate based imaging devices, and position sensitive gas detectors.

15. A method for forming a detector assembly, the method comprising;
   disposing a radiation conversion layer over a pixel array to form the detector assembly, wherein the radiation conversion layer is in direct contact with the pixel array; and
   disposing a light production layer between the radiation conversion layer and the pixel array.

16. The method of claim 15, wherein the radiation conversion layer comprises a metallic layer.

17. The method of claim 15, wherein the light production layer is disposed by coating a scintillator material over the radiation conversion layer.

18. The method of claim 15, wherein the light production layer is disposed by growing a plurality of needles onto the radiation conversion layer.

19. The method of claim 15, wherein the light production layer is disposed by coating a scintillator material over the pixel array.

20. The method of claim 15, further comprising disposing a contact layer between the light production layer and the pixel array.

21. The method of claim 20, wherein the light production layer is grown or coated on the contact layer.

* * * * *